(12) United States Patent
Kollmitzer et al.

(10) Patent No.: US 12,215,973 B2
(45) Date of Patent: Feb. 4, 2025

(54) MAGNETIC-FIELD-BASED ANGLE SENSOR SYSTEM WITH STRAY FIELD COMPENSATION AND METHOD FOR STRAY FIELD COMPENSATION

(71) Applicant: Infineon Technologies AG, Neubiberg (DE)

(72) Inventors: Benjamin Kollmitzer, Pörtschach (AT); Wolfgang Granig, Seeboden (AT); Udo Hafner, Klagenfurt (AT); Manuel Gillinger, Steindorf (AT)

(73) Assignee: Infineon Technologies AG, Neubiberg (DE)

( * ) Notice: Subject to any disclaimer, the term of this patent is extended or adjusted under 35 U.S.C. 154(b) by 299 days.

(21) Appl. No.: 17/406,496

(22) Filed: Aug. 19, 2021

(65) Prior Publication Data

US 2022/0057189 A1    Feb. 24, 2022

(30) Foreign Application Priority Data

Aug. 20, 2020  (DE) .......................... 102020210617.7

(51) Int. Cl.
*G01B 7/30* (2006.01)
*G01D 5/14* (2006.01)
(Continued)

(52) U.S. Cl.
CPC .............. *G01B 7/30* (2013.01); *G01D 5/145* (2013.01); *G01D 5/16* (2013.01); *G01D 5/24485* (2013.01);
(Continued)

(58) Field of Classification Search
CPC . G01B 7/30; G01D 5/145; G01D 5/16; G01D 18/001; G01D 5/24485;
(Continued)

(56) References Cited

U.S. PATENT DOCUMENTS 6,326,781 B1 * 12/2001 Kunde ................... G01D 5/145
324/144
6,724,184 B1 * 4/2004 Marx ..................... G01R 33/02
324/205

(Continued)

FOREIGN PATENT DOCUMENTS

CN        110196399 A      9/2019
DE     102010040584 A1    3/2012
(Continued)

*Primary Examiner* — Farhana A Hoque
*Assistant Examiner* — Joseph O Nyamogo
(74) *Attorney, Agent, or Firm* — Harrity & Harrity, LLP

(57) ABSTRACT

A magnetic-field-based angle sensor system includes a stator component and a rotor component rotatable relative thereto, a magnetic field sensor operating in saturation operation and a magnetic field sensor operating in linear operation, wherein the magnetic field sensor operating in saturation operation is configured to determine a rotation angle of the rotor component relative to the stator component, and wherein the magnetic field sensor operating in linear operation is configured to ascertain an external magnetic stray field acting on the angle sensor system. The angle sensor system further includes a control device configured, based on the ascertained external magnetic stray field, to compensate for a stray-field-dependent measurement deviation in the determination of the rotation angle carried out.

20 Claims, 11 Drawing Sheets

(51) Int. Cl.
- *G01D 5/16* (2006.01)
- *G01D 5/244* (2006.01)
- *G01D 5/245* (2006.01)
- *G01D 18/00* (2006.01)
- *G01R 33/07* (2006.01)
- *G01R 33/09* (2006.01)

(52) U.S. Cl.
CPC ......... *G01D 5/2451* (2013.01); *G01D 18/001* (2021.05); *G01R 33/07* (2013.01); *G01R 33/09* (2013.01)

(58) Field of Classification Search
CPC ........ G01D 5/2451; G01D 5/12; G01R 33/07; G01R 33/09
See application file for complete search history.

(56) References Cited

U.S. PATENT DOCUMENTS

| | | | |
|---|---|---|---|
| 10,816,363 B2 | 10/2020 | Ruigrok et al. | |
| 2011/0227560 A1* | 9/2011 | Haratani | B82Y 25/00 324/117 R |
| 2016/0069708 A1* | 3/2016 | Ausserlechner | G01P 3/38 324/207.23 |

FOREIGN PATENT DOCUMENTS

| | | | | |
|---|---|---|---|---|
| EP | 3255446 A1 * | 12/2017 | ......... | G01R 33/0011 |
| JP | 2012127736 A | 7/2012 | | |

\* cited by examiner

MAGNETIC-FIELD-BASED ANGLE SENSOR SYSTEM WITH STRAY FIELD COMPENSATION AND METHOD FOR STRAY FIELD COMPENSATION

RELATED APPLICATION

This application claims priority to German Patent Application No. 102020210617.7, filed on Aug. 20, 2020, which is incorporated herein by reference in its entirety.

FIELD

The present disclosure relates to a magnetic-field-based angle sensor system, and in particular to a magnetic-field-based angle sensor system with integrated stray field compensation for reducing and/or compensating for measurement deviations in the determination of a rotation angle between a rotor and a stator.

BACKGROUND

Angle sensors are used to ascertain rotation angles between a stator and a rotor rotatable relative thereto. This can involve a rotation by a few degrees, or else a rotation of 360° or more. By way of example, the rotor may rotate a number of times, and in some instances at very high angular velocities, about its own axis or relative to the stator.

Such angle measuring systems of the generic type generate a sine component, also referred to as y-component, and a cosine component, also referred to as x-component. The rotation angle can then be ascertained using the arc-tangent function (also referred to as arctan, a tan or $\tan^{-1}$), in accordance with:

$$\hat{\alpha} = \tan^{-1} \frac{Y}{X}$$

Such magnetic-field-based angle sensors find application for example in the automotive sector, e.g. in the electrical commutation of electric motors. The requirement in respect of the angle accuracy, i.e. the precision of the angle measurement, is constantly increasing in this case. In some instances, angle deviations of less than 0.2° are required in the measurement of the rotation angle. In practice, however, it is extremely difficult to realize such a small tolerance range since, in particular, external magnetic stray fields may lead to undesired measurement deviations that adversely influence the required precision.

SUMMARY

In order to lessen or compensate for the adverse influence of said external magnetic stray fields, magnetic shields can be used. However, providing and mounting such magnetic shields results in increased work and costs in the design and production of the applications.

In order to comply with the requirement for high precision in the angle determination, the present disclosure proposes a magnetic-field-based angle sensor system with integrated stray field compensation and a corresponding method for stray field compensation as claimed in the independent claims. Embodiments and further advantageous aspects of this angle sensor and of the corresponding method for stray field compensation are mentioned in the respective dependent patent claims.

The magnetic-field-based angle sensor system described herein includes a stator component and a rotor component rotatable relative thereto, wherein the rotor component includes a multipole magnet. Furthermore, the angle sensor system includes a magnetic field sensor operating in saturation operation and a magnetic field sensor operating in linear operation, wherein the magnetic field sensor operating in saturation operation is configured to determine a rotation angle of the rotor component relative to the stator component based on the magnetic field of the multipole magnet. By contrast, the magnetic field sensor operating in linear operation is configured to ascertain an external magnetic stray field acting on the angle sensor system. The angle sensor system furthermore includes a control device configured, based on the external magnetic stray field ascertained by means of the magnetic field sensor operating in saturation operation, to reduce and/or to compensate for a stray-field-dependent measurement deviation in the determination of the rotation angle carried out by means of the magnetic field sensor operating in saturation operation.

Moreover, a corresponding method for reducing and/or compensating for a measurement deviation in the determination of a rotation angle by means of a magnetic-field-based angle sensor system is proposed, wherein the method includes a step of providing a stator component and a rotor component rotatable relative thereto, wherein the rotor component includes a multipole magnet. Furthermore, the method includes providing a magnetic field sensor operating in saturation operation and a magnetic field sensor operating in linear operation. A rotation angle between the rotor component and the stator component can be determined by means of the magnetic field sensor operating in saturation operation, specifically based on the magnetic field of the multipole magnet. An external magnetic stray field acting on the angle sensor system can be determined by means of the magnetic field sensor operating in linear operation. On the basis of this ascertained magnetic stray field, a stray-field-dependent measurement deviation in the determination of the rotation angle can then be reduced and/or compensated for.

Exemplary embodiments are described in greater detail below with reference to the figures, wherein elements having the same or a similar function are provided with the same reference signs.

DETAILED DESCRIPTION

Method steps which are illustrated in a block diagram and explained with reference to same can also be carried out in a different order than that depicted or described. Moreover, method steps which relate to a specific feature of a device are interchangeable with precisely this feature of the device, which likewise holds true the other way around.

Insofar as compensation, in particular stray field compensation, is mentioned within this disclosure, this should be understood to mean attenuation or reduction. Stray field compensation is accordingly attenuation or reduction of a measurement deviation caused by the stray field. However, the term compensation can also be understood herein to mean complete reduction or elimination of a measurement deviation.

Insofar as a multipole magnet is mentioned within this disclosure, this is taken to mean a magnet, and in particular a permanent magnet, having at least two different poles. This can be for example a dipole magnet having one north pole and one south pole, a quadrupole magnet having two north poles and two south poles, a sextupole magnet having three north poles and three south poles, and the like. The poles of the multipole magnet can be situated opposite, for example diametrically opposite, one another. The multipole magnet can have various geometric shapes. By way of example, the multipole magnet can have a ring-shaped design. Moreover, everything described herein based on the example of a dipole magnet equally holds true for multipole magnets as well. The same also holds true the other way around.

Figure 1:
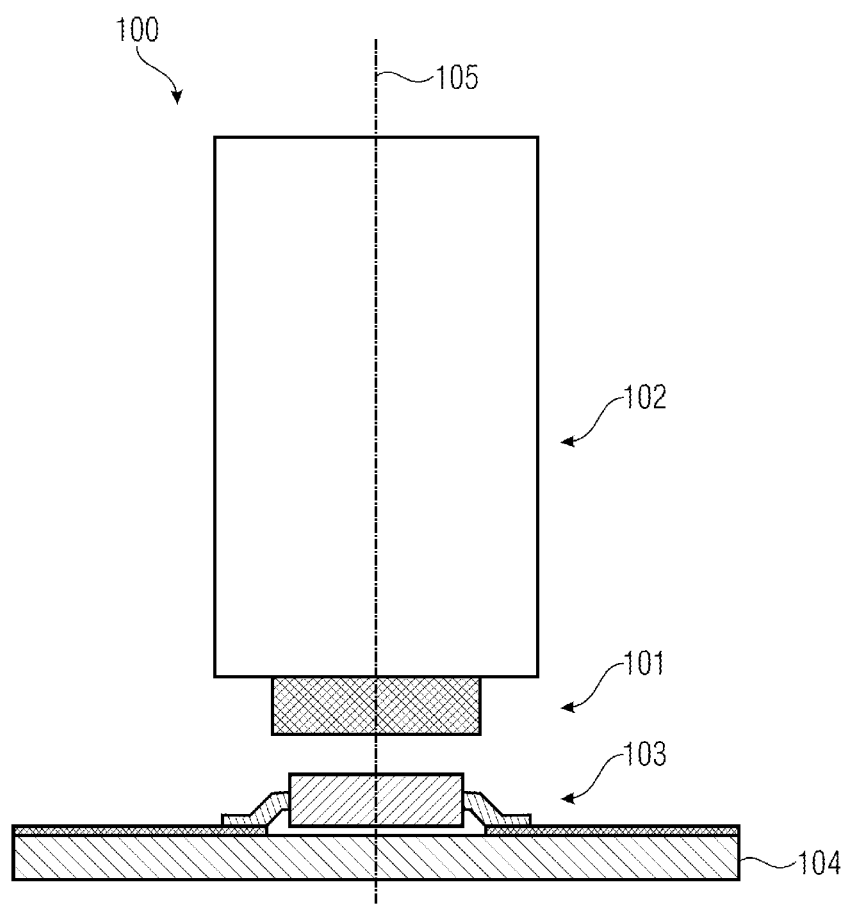
FIG. 1 shows a schematic lateral view of an angle sensor system in a so-called End-of-Shaft (EoF) embodiment in accordance with one exemplary embodiment.

FIG. 1 shows a magnetic-field-based angle sensor system 100 in accordance with one exemplary arrangement. This is a so-called End-of-Shaft (EoS) arrangement, in which a multipole magnet 101 is arranged at the end of a rotatable shaft 102. In this non-limiting example, the multipole magnet 101 can be a two-pole magnet (dipole magnet). In this case, the rotatable shaft 102 is a rotor component that rotates around the rotation axis 105.

A package 103 is arranged opposite the multipole magnet 101. The package 103 can be arranged on a stator component 104, for example a printed circuit board (PCB). The package 103 can comprise an angle sensor system. The angle sensor system can comprise at least one magnetic field sensor. The magnetic field sensor can be a magnetic angle sensor configured to ascertain the current rotation angle of the multipole magnet 101 rotating with the shaft 102 (rotor component) relative to the stator component 104.

The magnetic field sensor can be for example a magnetoresistive magnetic field sensor, and in particular a magnetic field sensor operating in saturation operation. As non-limiting examples, mention shall be made in this respect of AMR sensors, which utilize the anisotropic magnetoresistive effect (AMR), or GMR sensors, which utilize the giant magnetoresistance effect (GMR), or CMR sensors, which utilize the colossal magnetoresistive effect (CMR), or TMR sensors, which utilize the tunneling magnetoresistance effect (TMR). Within the present disclosure here, these types of magnetoresistive magnetic field sensors operating in saturation operation are also combined under the abbreviation xMR sensors.

Such magnetic field sensors operating in saturation operation generate a sine component, also referred to as y-component, and a cosine component, also referred to as x-component. The rotation angle between the rotor component and the stator component can then be ascertained using the arc-tangent function (also referred to as arctan, atan or $\tan^{-1}$), in accordance with:

$$\hat{\alpha} = \tan^{-1}\frac{Y}{X}$$

The xMR sensors have a very good signal to noise ratio (SNR). AMR sensors furthermore have an excellent stability vis-à-vis phase drift and errors regarding higher-order harmonics. However, AMR sensors are limited to an angle range of 180°, i.e. AMR sensors yield unambiguous results regarding the rotation angle to be measured only in a range of 180°. Moreover, AMR sensors may occasionally exhibit drifts in their output signal amplitude and a discernible offset.

Alternatively, or additionally, the angle sensor system depicted in FIG. 1 can comprise a magnetic field sensor operating in linear operation. As non-limiting examples, mentioned shall be made in this respect of Hall sensors or alternatively xMR sensors operating in linear operation. Hall sensors have an excellent linearity. Moreover, Hall sensors can have offset compensation (e.g. current spinning), which leads to the reduction and/or compensation of the intrinsic, i.e. system-inherent, offset.

Both types of magnetic field sensors mentioned above are susceptible to external interference fields, so-called external magnetic stray fields. These stray fields lead to deviations or errors in the angle measurement. Just the Earth's magnetic field can already lead to significant deviations in the determination of the rotation angle between the rotor component and the stator component. In this regard, for example in the case of a magnetic field sensor having an operating magnetic field amplitude of 20 mT, a stray field of approximately 100 μT, which corresponds approximately to the Earth's magnetic field, can already lead to angle errors of 0.3° or more.

In order to improve this problem in existing angle sensor systems, it is therefore proposed to provide an angle sensor system with integrated stray field compensation. An excerpt from such an angle sensor system is shown by way of example in FIG. 2.

Figure 2:
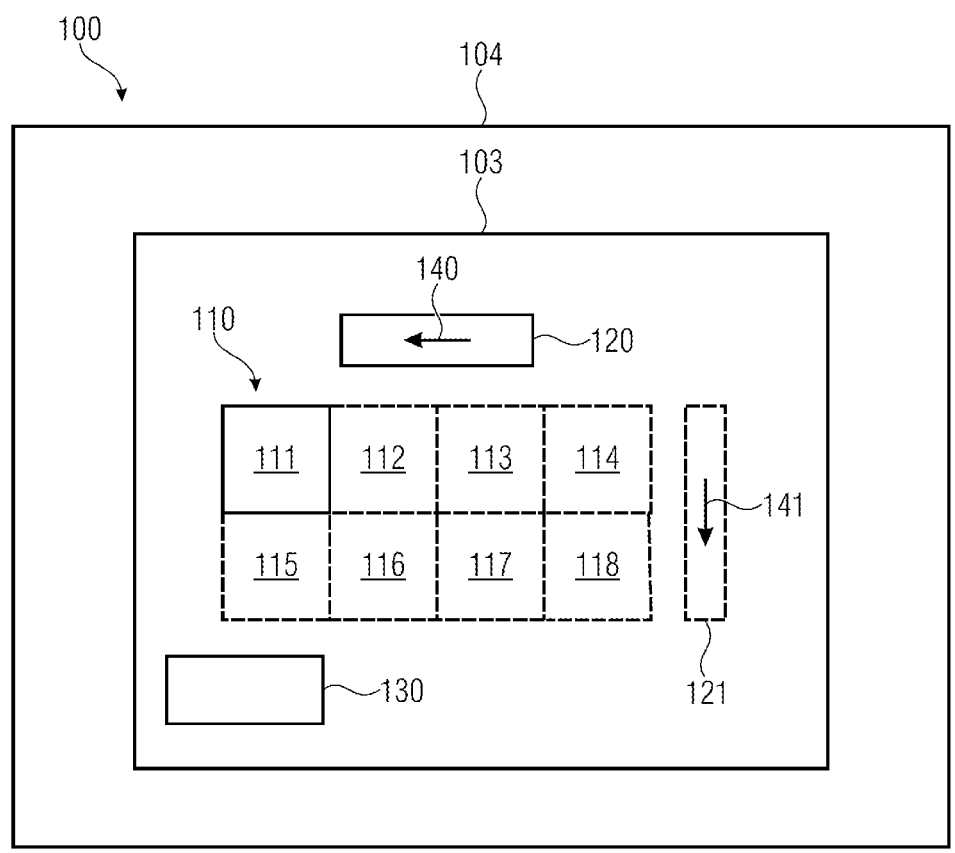
FIG. 2 shows a schematic plan view of an angle sensor system in accordance with one exemplary embodiment.

FIG. 2 shows a schematic plan view of a magnetic-field-based angle sensor system 100 in accordance with the concept described herein. The angle sensor system 100, as described above with reference to FIG. 1, can be arranged in a package 103. The package 103, or the angle sensor system 100, can be arranged on a substrate 104, such as a PCB, for example. The substrate 104 can be part of a stator component.

The angle sensor system 100 can comprise at least one magnetic field sensor 110 operating in saturation operation. The magnetic field sensor 110 operating in saturation operation can optionally comprise one or more sensor bridges, which here are illustrated using dashed lines and are provided with the reference signs 111, 112, . . . , 118.

The angle sensor system 100 can furthermore comprise at least one magnetic field sensor 120 operating in linear operation. Optionally, however, the angle sensor system 100 can also comprise a plurality of magnetic field sensors operating in linear operation, wherein here a further magnetic field sensor of this type is illustrated using dashed lines and is provided with the reference sign 121. Only the at least one magnetic field sensor 120 operating in linear operation will be explained in greater detail below, although all the explanations are, of course, likewise also applicable to all other magnetic field sensors operating in linear operation 121 etc.

The magnetic field sensor 110 operating in saturation operation can be an xMR sensor. xMR-based angle sensors 110 are usually operated in saturation. They measure the (cosine and sine of the) angle of the resulting magnetic field. This measuring method is particularly well suited to determining a rotation angle with high resolution.

xMR-based sensors can indeed have means for intrinsic offset compensation, i.e. for the compensation of offsets caused for example by the sensor elements themselves or the electron signal path. However, xMR-based sensors are susceptible to magnetic interference fields, e.g. to external magnetic stray fields. On account of saturation operation, the quantification of the magnetic offset caused by the external magnetic stray fields is not possible without restriction in xMR-based sensors and this magnetic offset results directly in a finite angle error. Moreover, xMR-based sensors generally lack the possibility of magnetic offset compensation, i.e. the compensation of an offset caused by external magnetic stray fields. However, these magnetic offsets limit the achievable measurement accuracy for standard End-of-Shaft (EoS) applications.

In the linear angle sensors used here, or in magnetic field sensors operating in linear operation generally, such a magnetic offset propagates linearly. Consequently, the magnetic offset can be quantified particularly well by means of the magnetic field sensors operating in linear operation. This holds true particularly if a magnetic field sensor operating in linear operation additionally also has intrinsic offset compensation (e.g. by means of current spinning). One non-limiting example of such a magnetic field sensor operating in linear operation would be a Hall sensor, or a Hall element. The magnetic field sensors operating in linear operation thus have minimal residual offsets. Moreover, magnetic stray fields can be very accurately ascertained and compensated for. The magnetic field sensors operating in linear operation have a low SNR, however, and are additionally sensitive to changes in mechanical stresses, in particular of shear stresses.

The concept proposed herein provides, then, for providing a magnetic-field-based angle sensor system 100 (FIG. 2), wherein this angle sensor system 100 comprises at least one magnetic field sensor 110 operating in saturation operation and in addition at least one magnetic field sensor 120 operating in linear operation.

The magnetic field sensor 110 operating in saturation operation can be configured to determine a rotation angle of the rotor component 102 relative to the stator component 104 based on the magnetic field of the multipole magnet 101 (FIG. 1). The magnetic field sensor 120 operating in linear operation can be configured to ascertain an external magnetic stray field acting on the angle sensor system 100.

The angle sensor system 100 can furthermore comprise a control device 130 configured, based on the external magnetic stray field that can be ascertained by means of the magnetic field sensor 120 operating in linear operation, to reduce and/or to compensate for a stray-field-dependent measurement deviation in the determination of the rotation angle, wherein the determination of the rotation angle can in turn be carried out by means of the magnetic field sensor 110 operating in saturation operation.

In other words, information about the magnetic stray field that is ascertained by means of the magnetic field sensor 120 operating in linear operation can be used to reduce or to compensate for measurement errors or measurement deviations of the magnetic field sensor 110 operating in saturation operation.

Figure 3:
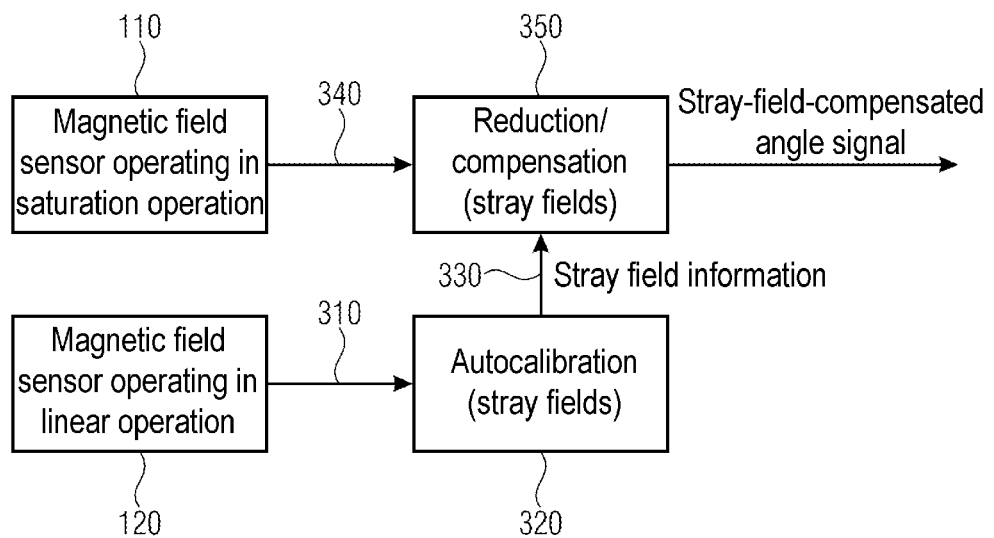
FIG. 3 shows a schematic block diagram for illustrating the concept described herein for stray field compensation in accordance with one exemplary embodiment.

FIG. 3 shows a schematic block diagram for elucidating a conceivable configuration for reducing or compensating for external magnetic stray fields. Insofar as magnetic stray fields are mentioned herein, this can be understood to mean that quasi-static magnetic stray fields are involved, i.e. stray fields which change significantly more slowly than the rotational frequency of the magnetic field used for angle measurement. Such magnetic stray fields can lead to a kind of constant offset that is added to the magnetic field used for angle measurement.

The magnetic field sensor 120 operating in linear operation can generate output signals 310 that can have a dependence on such an external magnetic stray field. By way of example, the output signals 310 can have, inter alia, a dependence on the strength of such an external magnetic stray field, i.e. the stronger the stray field, the greater the effect on the output signals 310. An autocalibration 320 can then in turn be applied to the output signals 310. The autocalibration 320 can be for example a calibration in which an amplitude offset caused by the stray field and/or a phase offset and/or an offset of the output signals 310 are/is ascertained.

Stray field information 330 can thus be ascertained in the autocalibration 320. The stray field information describes as it were the stray field. Said stray field information can then be applied to the output signals 340 of the magnetic field sensor 110 operating in saturation operation in order to reduce and/or compensate for measurement deviations.

In other words, the magnetic field sensor 110 operating in saturation operation generates output signals 340 that can be used for angle measurement between the rotor component 102 and the stator component 104. The output signals 340—representing the rotation angle—of the magnetic field sensor 110 operating in saturation operation have a dependence on the external magnetic stray field. The stray field information 330 ascertained by means of the magnetic field sensor 120 operating in linear operation, or during the autocalibration 320 of said sensor, can then be used to reduce or to compensate for this dependence of the output signals 340 of the magnetic field sensor 110 operating in saturation operation on the external magnetic stray field. In other words, the stray field information 330 can contain stray-field-dependent parameters that can be used for compensating for or reducing the measurement error of the magnetic field sensor 110 operating in saturation operation. For this reason, the stray field information 330 can also be referred to as stray-field-dependent compensation parameters.

As has already been mentioned in the introduction, the external magnetic stray field can add a kind of constant offset to the output signals 340 of the magnetic field sensor 110 operating in saturation operation. In order to reduce or to compensate for this offset, the stray-field-dependent compensation parameters 330 can contain offset information that was ascertained from the output signals 310 of the magnetic field sensor 120 operating in linear operation, e.g. during the autocalibration 320. Alternatively, or additionally, the stray-field-dependent compensation parameters 330 can contain amplitude information (e.g. an amplitude deviation) that was ascertained from the output signals 310 of the magnetic field sensor 120 operating in linear operation, e.g. during the autocalibration 320.

This will be explained in greater detail below with reference to FIGS. 4A-4C. The figures schematically show the above-discussed effect of a quasi-static magnetic stray field on the output signals 310, 340 of a magnetic-field-based angle sensor system 100 comprising a magnetic field sensor 110 operating in saturation operation and a magnetic field sensor 120 operating in linear operation in an EOS application, as shown in FIG. 1.

Figure 4A:
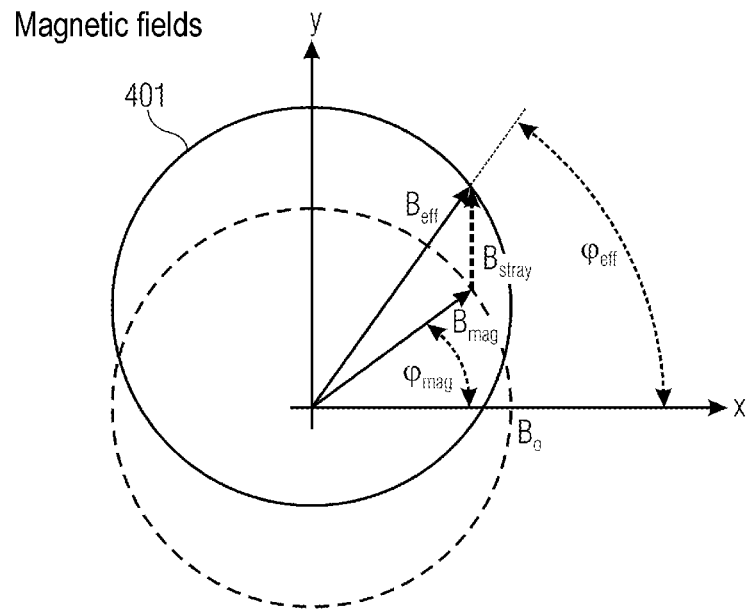
FIGS. 4A-4C show schematic illustrations for visualizing the effect of magnetic stray fields on the operating magnetic field of sensors operating in saturation operation and sensors operating in linear operation.

FIG. 4A shows a magnetic field vector $B_{mag}$ resulting from the multipole magnet 101, and associated angle information $\varphi_{mag}$ under the influence of a quasi-static magnetic stray field $B_{stray}$. The resulting effective magnetic field $B_{eff}$ contains deviating angle information $\varphi_{eff}$. As is illustrated by the circle 401 shown using solid lines, the effective magnetic field as a function of the angle describes a circle that is offset relative to the origin by the absolute value of the offset.

Figure 4B:
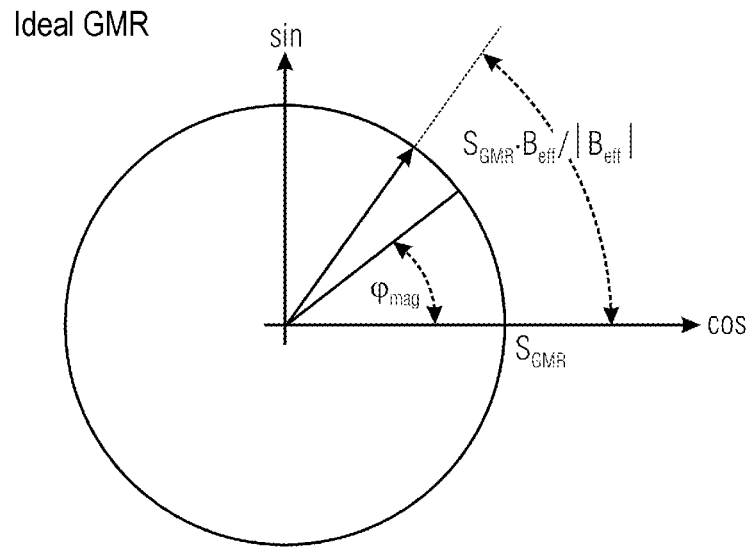

FIG. 4B shows the system response of an ideal magnetic field sensor 110 operating in saturation operation (here: a GMR sensor) with a signal amplitude $S_{GMR}$ to the effective magnetic field. The magnetic field sensor 110 operating in saturation operation normalizes the amplitude of the magnetic field vector with respect to its own signal amplitude $S_{GMR}$. For this reason, the output of the magnetic field sensor 110 as a function of the angle describes a circle whose center lies at the origin. However, any information about the external magnetic stray field is lost in this case. However, the output signal $\varphi_{eff}$ representing the rotation angle nevertheless contains an angle error (measurement deviation) on account of the magnetic stray field.

Figure 4C:
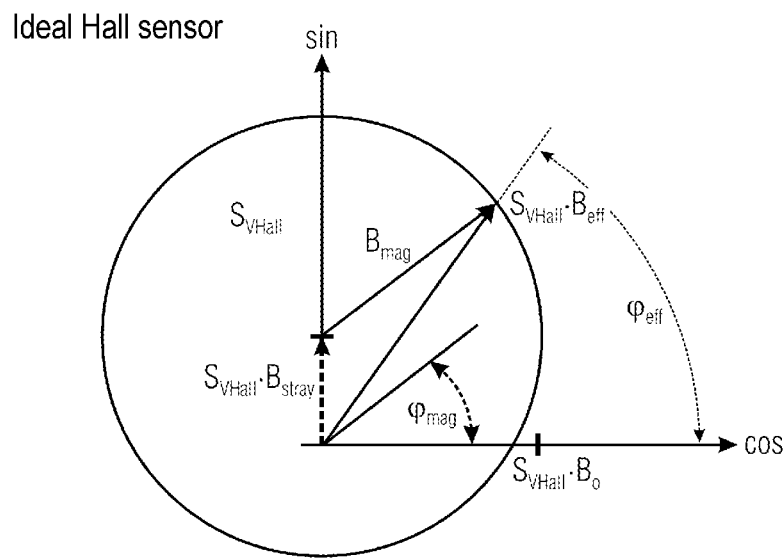

FIG. 4C shows the system response of an ideal magnetic field sensor 120 operating in linear operation (here: a Hall effect sensor) with a signal sensitivity $S_{VHall}$ to the effective magnetic field. The magnetic field sensor 120 operating in linear operation scales as it were the effective magnetic field vector on account of its sensitivity $S_{VHall}$. For this reason, the output of the magnetic field sensor 120 as a function of the angle describes a circle whose center is offset relative to the origin by the magnetic stray field. As has already been explained above with reference to FIG. 3, stray field information 330 can be ascertained, for example by means of an autocalibration 320, and the undesired effects thereof on the sensor output signal 340 of the magnetic field sensor 110 operating in saturation operation can be reduced or compensated for in order thus to obtain the original angle information $\varphi_{mag}$.

Possible exemplary embodiments for reducing or compensating for stray-field-dictated measurement deviations in the angle determination will be explained below by means of mathematical proofs:

Generally, the effective magnetic field in an EOS application under the influence of an external magnetic stray field $B_{stray}=(Bsx, Bsy)^T$ is given by:

$$B_{eff}(\varphi_{mag}) = B_{mag}(\varphi_{mag}) + B_{stray} = \begin{pmatrix} B_0\cos(\varphi_{mag}) + Bsx \\ B_0\sin(\varphi_{mag}) + Bsy \end{pmatrix}. \quad (1)$$

An ideal magnetic field sensor operating in linear operation responds to such an effective magnetic field by simply scaling it with its sensitivity, in accordance with:

$$\begin{pmatrix} X_{VHall} \\ Y_{VHall} \end{pmatrix} = S_{VHall} \cdot B_{eff}(\varphi_{mag}) = \begin{pmatrix} S_{VHall} \cdot B_0\cos(\varphi_{mag}) + S_{VHall} \cdot Bsx \\ S_{VHall} \cdot B_0\sin(\varphi_{mag}) + S_{VHall} \cdot Bsy \end{pmatrix}. \quad (2)$$

An autocalibration (e.g. a min/max search), such as has been described above with reference to FIG. 3, for example, results in the stray-field-dependent compensation parameters 330. The stray-field-dependent compensation parameters 330 can contain for example offset information (Ox, Oy) and/or amplitude information (Ax, Ay) of the output signals of the magnetic field sensor 120 operating in linear operation:

$$Ax=Ay=S_{VHall}\cdot B_0, \; Ox=S_{VHall}\cdot Bsx, \; Oy=S_{VHall}\cdot Bsy. \quad (3)$$

Here $Ax=(\max(X_{VHall})-\min(X_{VHall}))/2$ denotes the amplitude and $Ox=(\max(X_{VHall})+\min(X_{VHall}))/2$ denotes the offset of the x-channel. Ay and Oy denote the amplitude and the offset of the y-channel. For the purpose of carrying out the autocalibration, it is advantageous if at least one interval of at least 360° is swept over between the rotor component and the stator component. The quasi-static magnetic stray field $B_{stray}$ (normalized by means of the amplitude of the magnetic field $B_0$) can be quantified from these compensation parameters, in accordance with:

$$\frac{B_{stray}}{B_0} = \begin{pmatrix} Ox/Ax \\ Oy/Ay \end{pmatrix}. \quad (4)$$

The stray-field-dependent compensation parameters 330 can thus have for example a ratio between the offset information Ox, Oy and the amplitude information Ax, Ay, in accordance with:

offset information (x)/amplitude information (x)=Ox/Ax, and offset information (y)/amplitude information (y)=Oy/Ay.

As will be shown below, this stray field information, or the offset information (Ox, Oy) and/or amplitude information (Ax, Ay) contained therein, is already sufficient for determining the effect of the quasi-static magnetic stray field and for applying corresponding stray field compensation to the output signals 340 of the magnetic field sensor 110 operating in saturation operation.

An ideal magnetic field sensor operating in saturation operation responds to the effective magnetic field in accordance with equation (1) by generating the cosine and sine components of the effective angle, in accordance with:

$$\begin{pmatrix} X_{xMR} \\ Y_{xMR} \end{pmatrix} = S_{xMR} \cdot \begin{pmatrix} \cos(N_{xMR} \cdot \varphi_{eff}) \\ \sin(N_{xMR} \cdot \varphi_{eff}) \end{pmatrix} = \qquad (5)$$

$$S_{xMR} \cdot \begin{pmatrix} (B_0 \cos(N_{xMR} \cdot \varphi_{mag}) + Bsx)/|B_{eff}(\varphi_{mag})| \\ (B_0 \sin(N_{xMR} \cdot \varphi_{mag}) + Bsy)/|B_{eff}(\varphi_{mag})| \end{pmatrix}.$$

The factor $N_{xMR}$ has been introduced in equation (5) in order to distinguish between the various xMR technologies. $N_{xMR}=1$ for GMR and TMR technologies, which yield unambiguous output signals over a full period of 360°, and $N_{xMR}=2$ for AMR technologies, which yield unambiguous output signals only over an interval of 180°.

For GMR and TMR ($N_{xMR}=1$), a Taylor series expansion of equation (5) up to the first order of ($B_{stray}/B_0$) results in:

$$\begin{pmatrix} X_{xMR} \\ Y_{xMR} \end{pmatrix} = S_{xMR} \cdot \left( \begin{pmatrix} \cos(\varphi_{mag}) \\ \sin(\varphi_{mag}) \end{pmatrix} \cdot C_1(\varphi_{mag}) + \begin{pmatrix} Ox/Ax \\ Oy/Ay \end{pmatrix} \right) + \qquad (6)$$

$$\sigma\left(\left(\frac{B_{stray}}{B_0}\right)^2\right), \text{ for } N_{xMR} = 1.$$

The correction factor $C_1(\varphi_{mag}) = (1 - Ox/Ax \cdot \cos(\varphi_{mag}) - Oy/Ay \cdot \sin(\varphi_{mag}))$ has been introduced here. Higher-order terms $$\sigma\left(\left(\frac{B_{stray}}{B_0}\right)^2\right)$$

are subsequently designated by $\sigma(stray^2)$. Inverting equation (6) and disregarding higher-order terms yields:

$X4 = X2 \cdot C2(X2,Y2) - Ox/Ax + \sigma(stray^2)$, for $N_{xMR}=1$, $Y4 = Y2 \cdot C2(X2,Y2) - Oy/Ay + \sigma(stray^2)$, for $N_{xMR}=1$. (7)

Here $C_2(X2, Y2) = (1 + Ox/Ax \cdot X2 + Oy/Ay \cdot Y2)$ denotes the inverted correction factor (up to the first order), and X2 and Y2 denote the AOP-compensated xMR output signals (with regard to the term AOP compensation, see below).

The effect of the external magnetic stray field on the output signals 340—representing the rotation angle—of the magnetic field sensor 110 operating in saturation operation can likewise be determined. The arc-tangent function (or arctan 2) can be applied to equation (5) for this purpose. A subsequent Taylor series expansion up to the first order of ($B_{stray}/B_0$) results in:

$$N_{xMR} \cdot \varphi_{eff} = \arctan\left(\frac{Y_{xMR}}{X_{xMR}}\right) = \qquad (8)$$

$$\arctan\left(\frac{\sin(N_{xMR} \cdot \varphi_{eff})}{\cos(N_{xMR} \cdot \varphi_{eff})}\right) = \arctan\left(\frac{B_0 \sin(N_{xMR} \cdot \varphi_{mag}) + Bsy}{B_0 \cos(N_{xMR} \cdot \varphi_{mag}) + Bsx}\right) =$$

$$N_{xMR} \cdot \left(\varphi_{mag} + \frac{Oy}{Ay} \cdot \cos(\varphi_{mag}) - \frac{Ox}{Ax} \cdot \sin(\varphi_{mag})\right) + \sigma(stray^2).$$

In contrast to equation (6), which is not applicable to AMR sensors without any restriction, equation (8) holds true for GMR-, TMR- and AMR-based angle sensors. If equation (8) is then inverted and the higher-order terms are again disregarded, then this yields the following:

$$\varphi_{eff} = \frac{1}{N_{xMR}} \cdot \arctan\left(\frac{Y2}{X2}\right) \qquad (9)$$

$$\varphi_{mag} = \varphi_{eff} + \frac{Ox}{Ax} \cdot \sin(\varphi_{eff}) - \frac{Oy}{Ay} \cdot \cos(\varphi_{eff}) + \sigma(stray^2).$$

Here X2 and Y2 denote the AOP-compensated xMR output signals (with regard to AOP compensation, see below). For AMR-based angle sensors it is advantageous if the correct half-plane for determining the angle $\varphi_{eff}$ is determined. This can be done for example by picking off "quadrant information" from the signal path of the magnetic field sensor 120 operating in linear operation (e.g. Hall effect sensor), or by internally tracking the respective quadrant.

As has already been mentioned in the introduction, the magnetic field sensor 110 operating in saturation operation can determine the rotation angle between the rotor component 102 and the stator component 104 by calculation of the arc-tangent function of the sine and cosine components of the output signals, in accordance with:

$$\hat{\alpha} = \tan^{-1} \frac{Y}{X}$$

The calculation of the rotation angle is also referred to as CORDIC herein. For TMR- and GMR-based angle sensors, their AOP-compensated output signals $X2 = \cos(\varphi_{eff})$ and $Y2 = \sin(\varphi_{eff})$ can be used directly for the calculation of the rotation angle (CORDIC). For AMR-based angle sensors, by contrast, a preceding further CORDIC implementation is required in order to calculate the sine and cosine of the angle $\varphi_{eff}$.

Equations (3), (4), (7) and (9) form the basis for the autocalibration and stray field compensation described herein. The stray field compensation itself can be effected in various ways here. By way of example, the output signals 340 of the magnetic field sensor 110 operating in saturation operation can be compensated for using the stray-field-dependent compensation parameters 330 (ascertained by means of the magnetic field sensor 120 operating in linear operation), specifically before the rotation angle is calculated (so-called pre-CORDIC). As an alternative thereto, firstly the rotation angle can be calculated from the output signals 340 of the magnetic field sensor 110 operating in saturation operation and after that the stray-field-dependent compensation parameters 330 (ascertained by means of the magnetic field sensor 120 operating in linear operation) can be applied to the calculated rotation angle for the purpose of stray field compensation (so-called post-CORDIC).

Figure 5A:
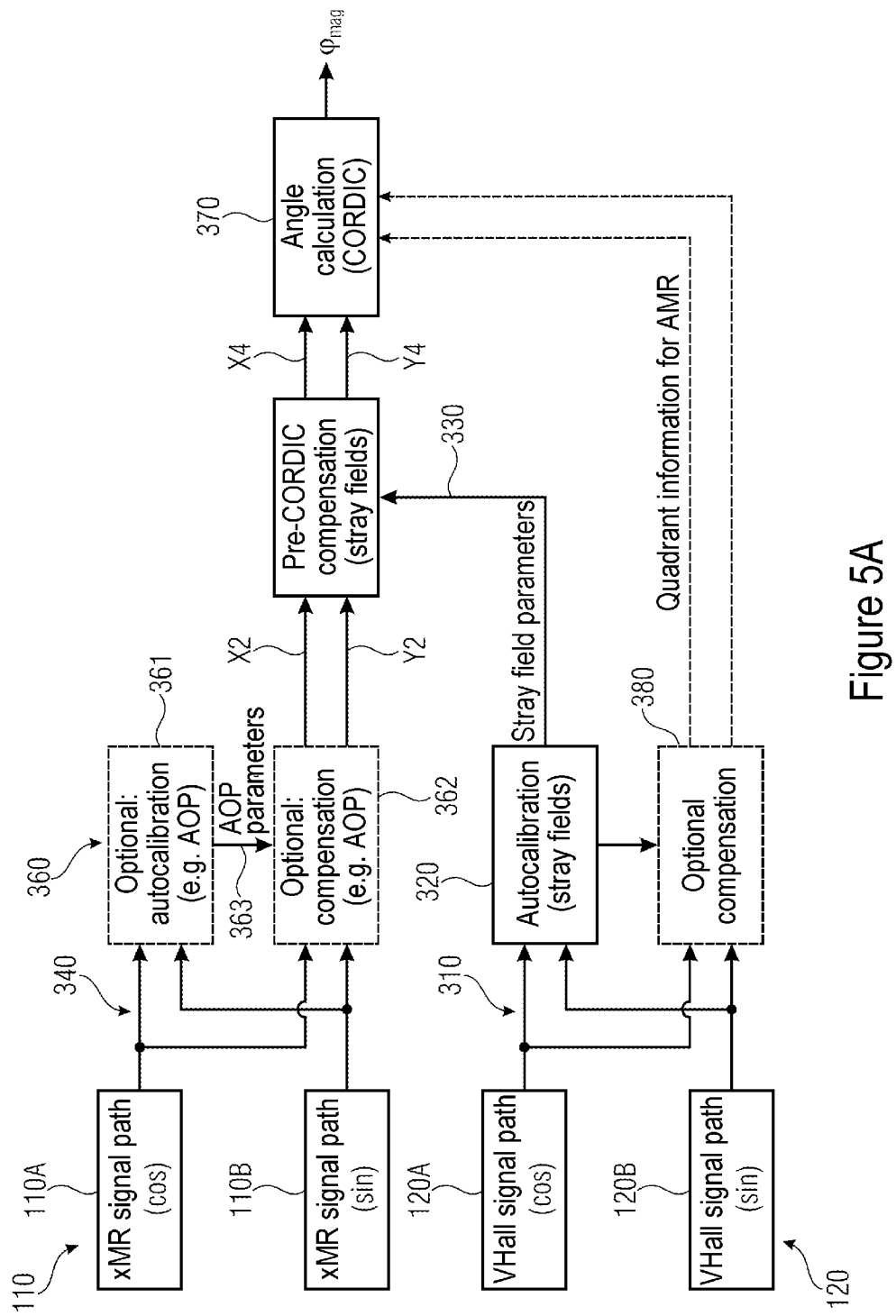
FIG. 5A shows a schematic block diagram for illustrating the concept described herein for stray field compensation by means of pre-CORDIC in accordance with one exemplary embodiment.

FIG. 5A shows a schematic block diagram for illustrating one exemplary embodiment for stray field compensation, wherein firstly the output signals 340 of the magnetic field sensor 110 operating in saturation operation are compensated for using the stray-field-dependent compensation parameters 330 (ascertained by means of the magnetic field sensor 120 operating in linear operation) and subsequently the rotation angle is calculated (pre-CORDIC).

FIG. 5A schematically illustrates a magnetic field sensor 110 operating in saturation operation and a magnetic field sensor 120 operating in linear operation. The signal path of the magnetic field sensor 110 operating in saturation operation is divided into a first signal path 110A, which includes a cosine component of the sensor signal, and into a second signal path 110B, which includes a sine component of the sensor signal. The same applies to the magnetic field sensor 120 operating in linear operation. The signal path of the magnetic field sensor 120 operating in linear operation is divided into a first signal path 120A, which includes a cosine component of the sensor signal, and into a second signal path 120B, which includes a sine component of the sensor signal.

The output signals 340 of the magnetic field sensor 110 operating in saturation operation can optionally be subjected to a so-called AOP correction 360. The term AOP stands for amplitude—phase—offset. That is to say that the output signals 340 can be processed insofar as an amplitude offset and/or a phase offset and/or a static offset are/is reduced or compensated for. The AOP correction 360 can include an AOP calibration 361 and a subsequent AOP compensation 362, wherein the AOP calibration 361 yields the corresponding AOP parameters 363, which can then in turn be applied to the output signals 340 for AOP compensation.

In accordance with such an exemplary embodiment, the control device 130 can thus be configured, before applying the stray-field-dependent compensation parameters 330, to carry out an amplitude-phase-offset correction 360 of the output signals 340 of the magnetic field sensor 110 operating in saturation operation, wherein in the amplitude-phase-offset correction 360 an amplitude offset compensation and/or a phase offset compensation and/or an offset compensation are/is applied to the output signals 340 of the magnetic field sensor 110 operating in saturation operation.

Such an AOP correction 360 minimizes linear irregularities in the xMR signal path, and e.g. offsets and amplitude offsets. For the purpose of the AOP correction 360, for example a min/max determination can be applied to the output signals 340 ($X_{xMR}$ and $Y_{xMR}$), in particular in an interval of at least 360° for GMR- and TMR-based sensors, or alternatively in an interval of 180° for AMR-based sensors. From the maxima and minima found, it is then possible to determine the amplitudes $Ax_{xMR}$, $Ay_{xMR}$ and the offsets $Ox_{xMR}$, $Oy_{xMR}$ in the respective signal path 110A, 110B.

Once the AOP autocalibration 361 has ended, i.e. as soon as sufficiently good estimated values for the AOP parameters 363 have been attained, these AOP parameters 363 can be used for the AOP compensation 362, such that AOP-compensated output signals X2, Y2 result therefrom, in accordance with:

$$X2 = (X_{xMR} - Ox_{xMR})/Ax_{xMR} \text{ and } Y2 = (Y_{xMR} - Oy_{xMR})/Ay_{xMR}$$

The AOP autocalibration 361 can be carried out continuously in order to improve the result in the determination of the AOP parameters 363 derivable therefrom over time.

In parallel therewith it is possible to carry out the autocalibration 320 of the output signals 310 of the magnetic field sensor 110 operating in saturation operation, said autocalibration already having been explained above with reference to FIG. 3. The stray-field-dependent compensation parameters 330 can thereby be ascertained. The stray-field-dependent compensation parameters 330 can be ascertained for example in accordance with equation (4) above. In particular, the stray-field-dependent compensation parameters 330 can contain amplitude information and/or offset information of the output signals 310, for example the ratios Ox/Ax and Oy/Ay presented above in equation (4).

The stray-field-dependent compensation parameters 330 can then be used to subject the (optionally AOP-compensated) output signals 340 or X2, Y2 of the magnetic field sensor 110 operating in saturation operation to stray field compensation. By way of example, stray field compensation using equation (7) above results in stray-field-compensated output signals X4, Y4, which can then in turn be used to calculate the stray-field-compensated rotation angle $\varphi_{mag} = \arctan(Y4/X4)$ (see angle calculation CORDIC in block 370).

Optionally, the output signals 310 of the magnetic field sensor 120 operating in linear operation can be subjected to further compensation 380, whereby quadrant information can be derived specifically for AMR-based sensors. Said information can then be taken into account in the calculation of the stray-field-compensated rotation angle $\varphi_{mag}$.

In summary, therefore, in the pre-CORDIC approach shown in FIG. 5A, the control device 130 can be configured, based on the output signals 340 of the magnetic field sensor 110 operating in saturation operation, to carry out an angle calculation indicating the rotation angle of the rotor component 102 relative to the stator component 104, and the control device 130 can furthermore be configured, before the angle calculation, to apply the stray-field-dependent compensation parameters 330 to the output signals 340 of the magnetic field sensor 110 operating in saturation operation in order thereby to compensate for the measurement deviation in the determination of the rotation angle.

Figure 5B:
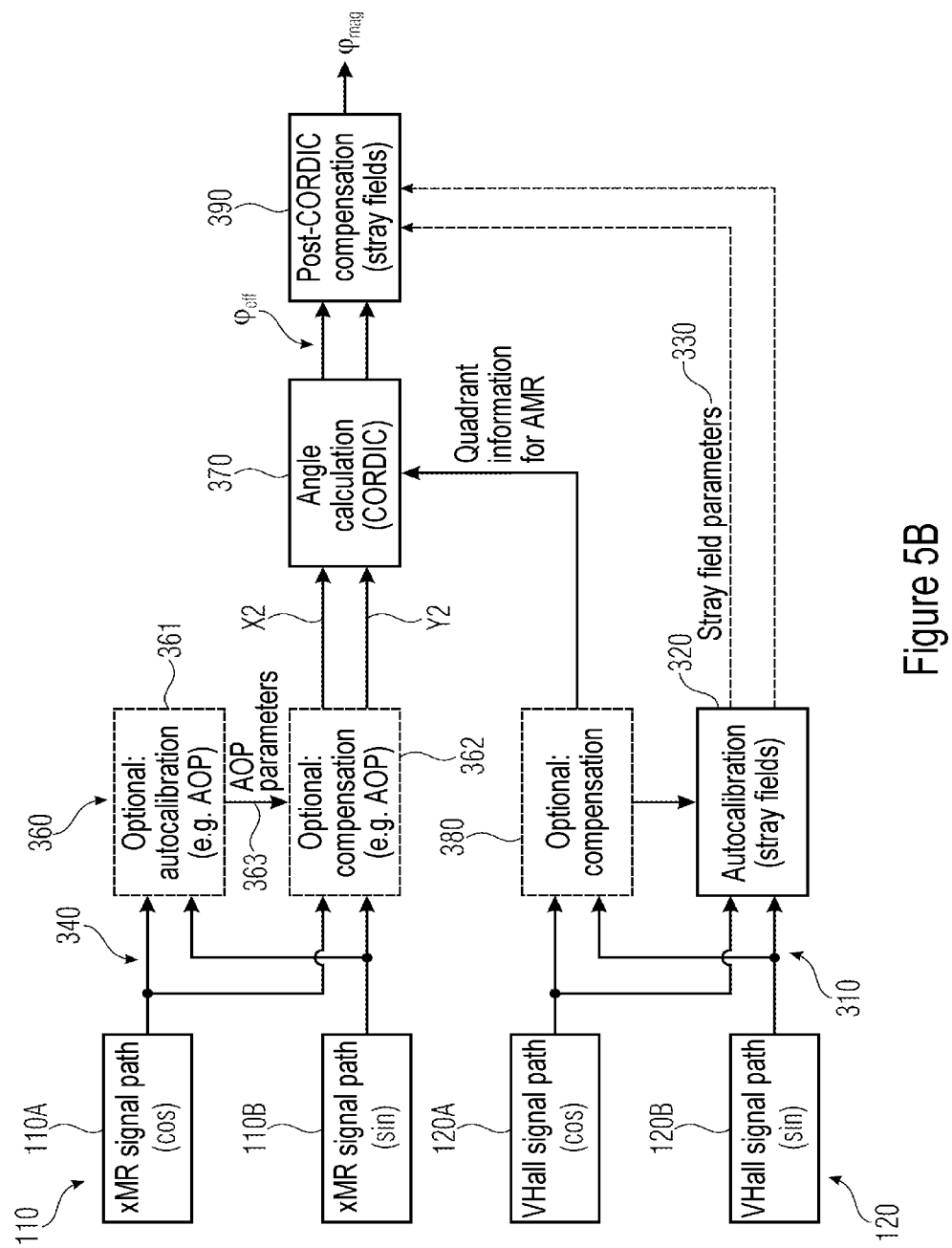
FIG. 5B shows a schematic block diagram for illustrating the concept described herein for stray field compensation by means of post-CORDIC in accordance with one exemplary embodiment.

FIG. 5B shows an alternative approach for determining the stray-field-compensated rotation angle $\varphi_{mag}$. This is the abovementioned post-CORDIC approach, in which firstly the effective rotation angle $\varphi_{eff}$ is calculated from the (optionally AOP-compensated) output signals 340 or X2, Y2 of the magnetic field sensor 110 operating in saturation operation and after that the stray-field-dependent compensation parameters 330 (ascertained by means of the magnetic field sensor 120 operating in linear operation) are applied to the calculated rotation angle $\varphi_{eff}$ for the purpose of stray field compensation (so-called post-CORDIC), in order thereby to ascertain the stray-field-compensated rotation angle $\varphi_{mag}$.

Identical function blocks having the same function as in FIG. 5A are provided with the same reference numbers, for which reason a repeated explanation shall be dispensed with at this juncture and instead reference shall be made to the explanations concerning FIG. 5A.

One difference with respect to FIG. 5A is, inter alia, that here in block 370 firstly an angle calculation (CORDIC) of the effective magnetic angle $\varphi_{eff}$ is carried out based on the (optionally AOP-compensated) output signals 340 or X2, Y2 of the magnetic field sensor 110 operating in saturation operation. The angle calculation (CORDIC) can be carried out in accordance with the first line from equation (9), for example, wherein the correct half-plane should concomitantly be taken into consideration for AMR-based sensors. Subsequently, in block 390, for the purpose of stray field compensation, the stray-field-dependent compensation parameters 330 can then be applied to the previously calculated effective magnetic angle $\varphi_{eff}$, e.g. as indicated in the second line of equation (9). The stray-field-compensated rotation angle $\varphi_{mag}$ is then accordingly obtained as the result.

In summary, therefore, in the post-CORDIC approach shown in FIG. 5B, the control device 130 can be configured, based on the output signals 340 of the magnetic field sensor 110 operating in saturation operation, to carry out an angle calculation indicating the rotation angle of the rotor component 102 relative to the stator component 104, and the control device 130 can furthermore be configured, after the angle calculation, to apply the stray-field-dependent compensation parameters 330 to the result of the angle calculation in order thereby to compensate for the measurement deviation in the determination of the rotation angle.

Figure 6A:
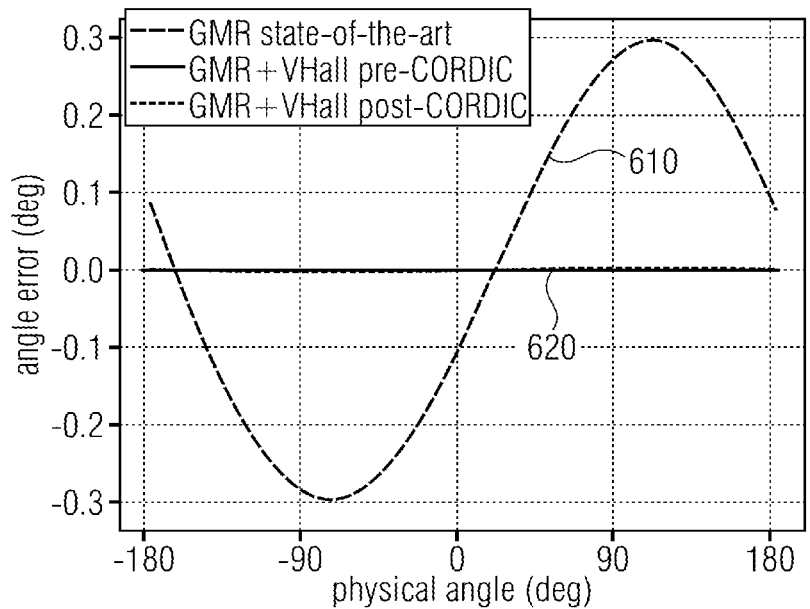
FIGS. 6A and 6B show functions of angle measurement signals of a simulation of the concept described herein for stray field compensation in accordance with one exemplary embodiment.
Figure 6B:
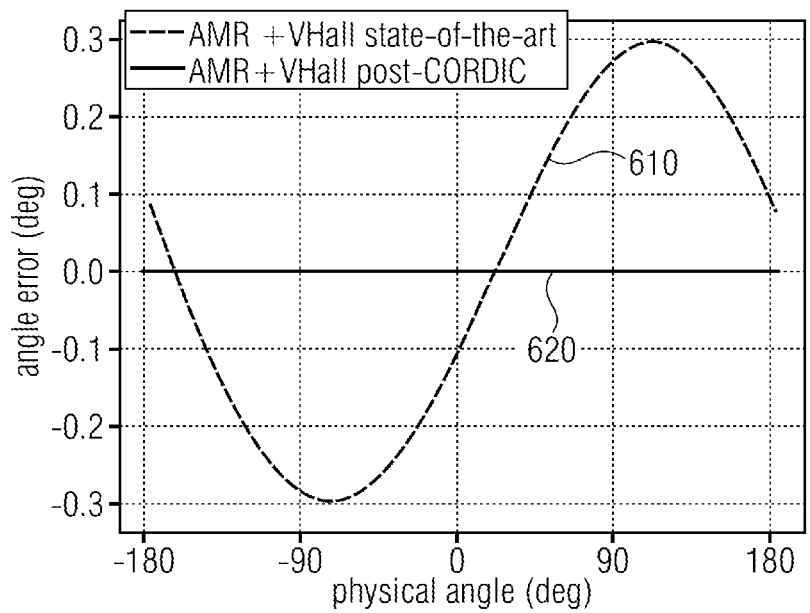

For confirmation of the method described herein, two simulations were carried out, which shall be described in greater detail with reference to FIGS. 6A and 6B. FIG. 6A shows the result of a measurement in which a Hall effect sensor 120 operating in linear operation was combined with a GMR-based sensor 110 operating in saturation operation. FIG. 6B shows the result of a measurement in which a Hall effect sensor 120 operating in linear operation was combined with an AMR-based sensor 110 operating in saturation operation.

An operating magnetic field having an amplitude of $B_0$=20 mT was assumed in both measurements. In addition, magnetic stray fields $B_{stray}$=(100 uT, 30 uT)$^T$ were assumed. Both pre-CORDIC and post-CORDIC stray field compensations in accordance with the principles described herein were applied in order to compensate for or reduce the measurement error in the determination of the rotation angle. As can be discerned in the figures, the concept described herein reduces the effects of the magnetic stray field on the calculation of the rotation angle $\varphi_{mag}$ by two orders of magnitude.

In this regard, FIGS. 6A (Hall effect sensor+GMR sensor) and 6B (Hall effect sensor+AMR sensor) reveal a measurement error 610 in the determination of the rotation angle which fluctuates in a range of between +0.3° and −0.3° over a full angle interval of 360°. In other words, the external magnetic stray field results in a systematic error or deviations in the angle measurement of up to 0.6° effective. Using the concept described herein, this measurement error can be reduced or completely compensated for, which is illustrated by the depicted function 620.

Figure 7:
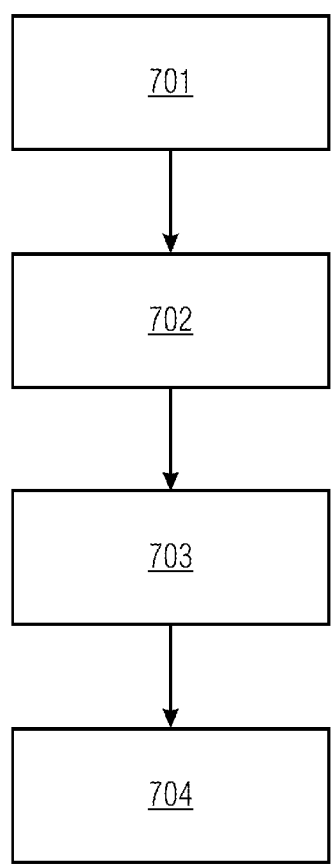
FIG. 7 shows a schematic block diagram for illustrating a method for stray field compensation in accordance with one exemplary embodiment.

The concept described herein also relates to a corresponding method for stray field compensation in angle sensor systems 100. In this regard, FIG. 7 shows one exemplary embodiment of such a method for reducing and/or compensating for a measurement deviation in the determination of a rotation angle by means of a magnetic-field-based angle sensor system 100.

In block 701, a stator component 104 and a rotor component 102 rotatable relative thereto are provided, wherein the rotor component 102 comprises a multipole magnet 101.

In block 702, a magnetic field sensor 110 operating in saturation operation and a magnetic field sensor 120 operating in linear operation are provided.

In block 703, a rotation angle between the rotor component 102 and the stator component 104 is determined, specifically by means of the magnetic field sensor 110 operating in saturation operation based on the magnetic field of the multipole magnet 101.

In block 704, an external magnetic stray field acting on the angle sensor system 100 is determined by means of the magnetic field sensor 120 operating in linear operation, and a stray-field-dependent measurement deviation is compensated for in the determination of the rotation angle, specifically based on the ascertained magnetic stray field.

In summary, it can thus be stated that a magnetic-field-based angle measuring system or angle sensor system 100 with integrated stray field compensation is proposed in accordance with the concept described herein. For the purpose of stray field compensation, the angle sensor system 100 comprises a combination of a magnetic field sensor 110 operating in saturation operation with a magnetic field sensor 120 operating in linear operation. Accordingly, the linear properties of the signal path of a magnetic field sensor 120 operating in linear operation (e.g. a Hall effect sensor) can be combined with the saturated behavior of the signal path of a magnetic field sensor 110 operating in saturation operation (e.g. an xMR sensor). This affords an effective and at the same time cost-effective technical solution for the reduction or compensation of measurement deviations caused by external magnetic stray fields, without this necessitating expensive additional shields.

By means of the concept described herein, the effect of quasi-static external magnetic stray fields on a sensor circuit of an angle sensor system 100 can advantageously be compensated for by sensors 110 (e.g. xMR) operating in saturation operation being combined with sensors 120 (e.g. based on vertical Hall plates) operating in linear operation. The sensors 110 operating in saturation operation measure the effective rotation angle, which may be beset by measurement errors on account of the magnetic stray field. The sensors 120 operating in linear operation determine the magnetic offset established on account of the magnetic stray field. This information can then be used for compensation of the output signals of the magnetic field sensor 110 operating in saturation operation.

Promising candidates for achieving highly precise angle measurements are afforded by the combination of sensors 110 operating in saturation operation with sensors 120 operating in linear operation. In addition, this combination of sensors 110, 120 offers redundant and diverse measurement technologies for functional safety applications. The combination of sensors 110, 120 unites as it were the advantages of both sensor technologies: quasi-static magnetic stray fields are compensated for, good SNR, and excellent phase stability for AMR-based sensors.

The concept described herein describes, in other words, an autocalibration of and compensation for quasi-static magnetic stray fields for combined linear and saturated angle sensors 110, 120.

It has already been mentioned a number of times that AMR-based sensors (as one non-limiting example of a sensor 110 operating in saturation operation) yield unambiguous results only within an angle interval of 180°. After a rotation of the rotor relative to the stator by 180°, the angle signal is repeated. Ambiguities in the interpretation of the measurement result can thus occur. In order that the concept proposed herein is expediently applied to AMR-based angle sensors as well, a solution approach for this is proposed below.

Firstly, in this regard, it shall be mentioned once again that, in the case of magnetoresistive measurement principles in comparison with Hall effect sensor technology, the signal amplitudes are generally not field-size-dependent, since magnetoresistive sensors operate in saturation operation. AMR-based sensors, in particular, do indeed yield measurement results with the smallest possible angle error (e.g. less than 0.2°). However, they exhibit unambiguous measurement results only in an angle interval of 180°.

In order to counter this circumstance, it is proposed to combine an AMR-based sensor 110 operating in saturation operation with at least one Hall effect element 120, and in particular with a vertical Hall effect element 120 operating in linear operation. In this case, the term "vertical" relates to the chip plane of the AMR-based sensor 110.

For further explanation, reference shall be made to FIG. 2 again at this juncture. FIG. 2 shows one exemplary embodiment of an angle sensor system 100 comprising an AMR-based sensor 110. The AMR-based sensor 110, as depicted purely by way of example here, can comprise a plurality of sensor bridges 111, 112, . . . , 118. The AMR-based sensor 110 is arranged in a main plane of extent, the so-called chip plane (here: parallel to the plane of the drawing in the plan view illustrated). The angle sensor system 100 furthermore comprises a first vertical Hall effect sensor 120. The first vertical Hall effect sensor 120 is arranged vertically with respect to the chip plane of the AMR-based sensor 110. Optionally, the angle sensor system 100 can comprise a second vertical Hall effect sensor 121. The second vertical Hall effect sensor 121 is likewise arranged vertically with respect to the chip plane of the AMR-based sensor 110.

The first and/or second Hall effect sensor 120, 121 can be arranged laterally next to the AMR-based sensor 110, or above or below the AMR-based sensor 110. However, the first and/or second Hall effect sensor 120, 121 can also be arranged anywhere else on the substrate 104.

In accordance with one conceivable exemplary embodiment, the first vertical Hall effect sensor 120 can be arranged perpendicularly, i.e. at an angle of 90°, relative to the second vertical Hall effect sensor 121. Since the vertical Hall effect sensors 120, 121 each have a specific preferred direction 140, 141 for determining the magnetic field, the respective preferred directions 140, 141 of the respective vertical Hall effect sensor 120, 121 can thus also be oriented perpendicularly, i.e. at an angle of 90°, relative to one another. The first vertical Hall effect sensor 120 can thus be sensitive in an x-direction, for example, while in contrast the second vertical Hall effect sensor 121 can be sensitive in a y-direction. Consequently, the correct half-plane for unambiguously determining the output signals (angle measurement results) of the AMR-based sensor 110 can be determined particularly advantageously.

This 90° arrangement thus makes it possible to use the first and/or second vertical Hall effect sensor 120, 121 for unambiguously determining the corresponding half-plane in the angle measurement results of the AMR-based sensor 110. The angle sensor system 100, despite the use of an AMR-based sensor 110, can thereby yield unambiguous measurement results over an angle interval of 360°.

Since AMR-based sensors 110 thus output two ambiguous angle values within an angle interval of 360°, the first and/or second vertical Hall effect sensor 120, 121 can be used to distinguish the half-plane in which the AMR sensor 110 is currently operating.

Figure 8:
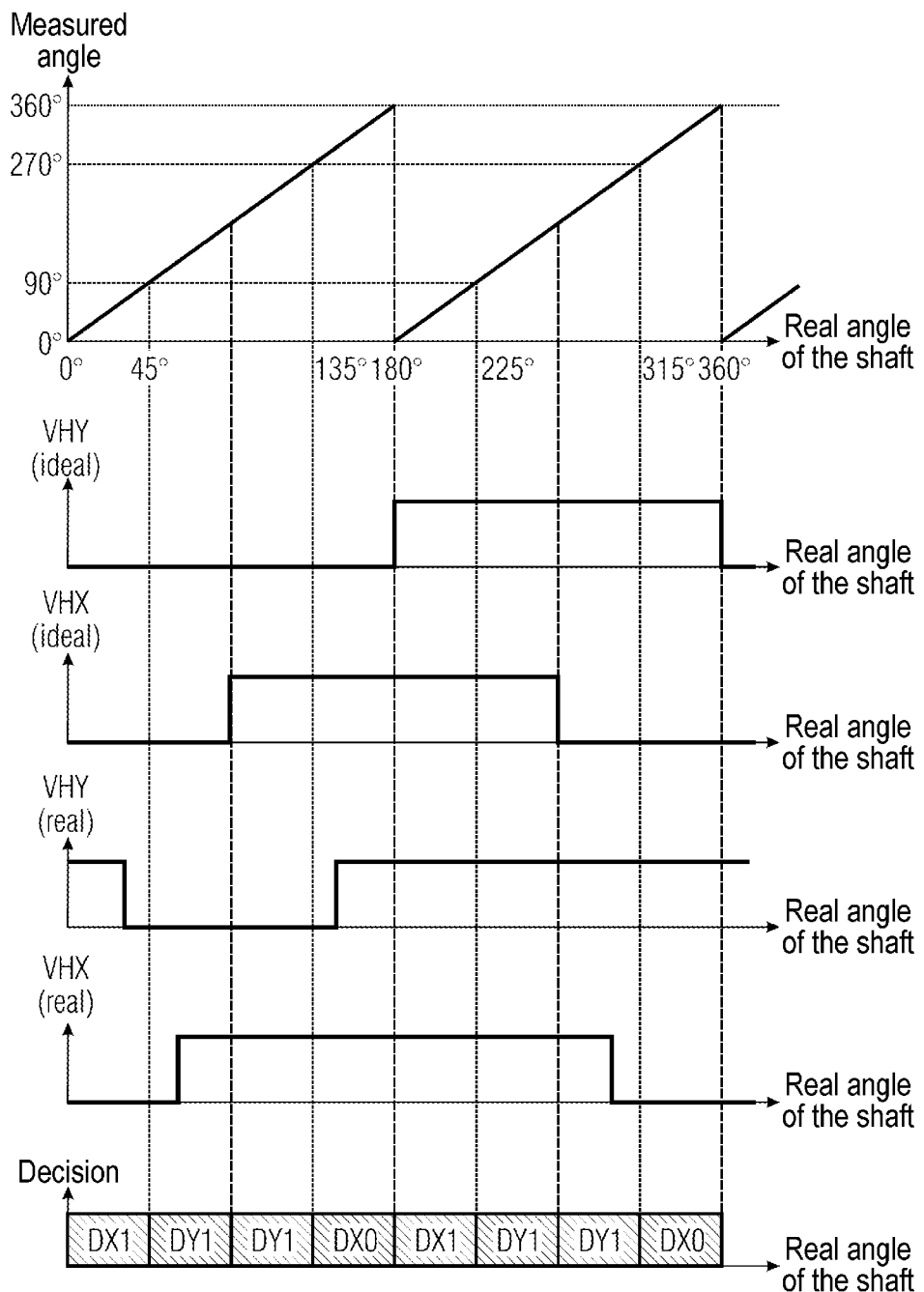
FIG. 8 shows diagrams for elucidating output signals of a real and an ideal vertical Hall effect sensor for decision-making about the correct half-plane in the determination of an electrical angle by means of an AMR-based sensor in accordance with one exemplary embodiment.

FIG. 8 depicts the signals over a full 360° rotation of the shaft 102 (FIG. 1). It should be mentioned at this juncture that for the explanation described herein, a distinction is drawn between a so-called mechanical angle and a so-called electrical angle. The mechanical angle describes the actual real rotation of the rotor component 102. The electrical angle describes the angle signal of the sensor, i.e. the calculated angle output by the sensor. In other words, while the rotor component can really rotate by a mechanical angle of 360°, the electrical angle that was measured by means of an AMR-based sensor 110 is unambiguous only within an angle interval of 180°.

FIG. 8 (1st column from the top) shows the electrical angle, that is to say the measured angle, on the y-axis and the real mechanical angle of the rotor component on the x-axis. It can be discerned that two identical signals between 0° and 180° and between 180° and 360° are present here. The diagrams arranged underneath illustrate the ideal output signals of an ideal first vertical Hall effect sensor (2nd column from the top) and of an ideal second vertical Hall effect sensor (3rd column from the top) arranged offset by 90° with respect thereto. The diagrams arranged underneath illustrate the output signals of a real first vertical Hall effect sensor (4th column from the top) and of a real second vertical Hall effect sensor (5th column from the top) arranged offset by 90° with respect thereto.

The sensor signals depicted here are discretized, e.g. by means of a comparator function, wherein positive signals yield a logic 0 and negative signals yield a logic 1 at the output.

Since Hall effect sensors have a measurement signal deviation, the output signals of both Hall effect sensors 120, 121 (X and Y) are used to determine the correct half-plane. The bottommost column in FIG. 8 shows a decision diagram that is taken as a basis for making a decision as to which half-plane is intended to be used for the angle measurement. In this case, a decision is taken as to whether or not 180° are added to the output signal of the AMR-based sensor. The following logic can be applied here:

| | |
|---|---|
| DX0 | Add +180° if the output signal (VHX) in the X-direction is equal to 0 (positive) −> is applied between 270° and 360° (electrical angle) |
| DX1 | Add +180+ if the output signal (VHX) in the X-direction is equal to 1 (negative) −> is applied between 0° and 90° (electrical angle) |
| DY1 | Add +180° if the output signal (VHY) in the Y-direction is equal to 1 (negative) −> is applied between 90° and 270° (electrical angle) |

This method yields reliable results provided that the point of intersection of the output of the Hall sensor comparator function is situated within the Hall sensor amplitude circle. This will be explained in greater detail below with reference to FIG. 9.

Figure 9:
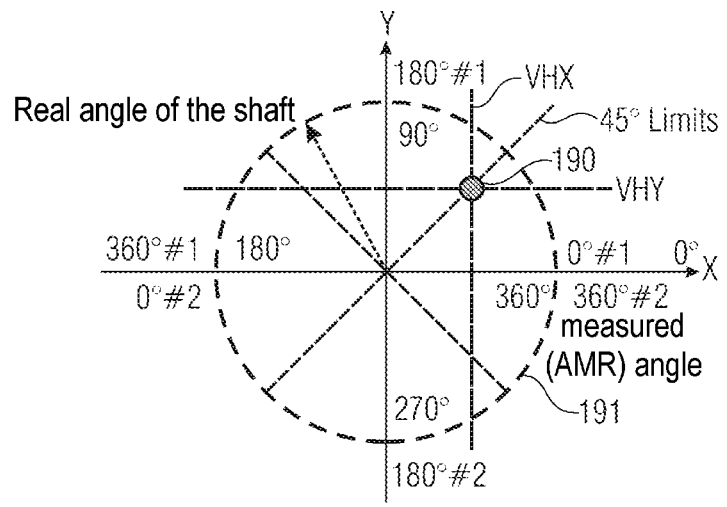
FIG. 9 shows an amplitude circle for elucidating the correction of the half-plane in AMR-based sensors in accordance with one exemplary embodiment.

FIG. 9 shows a circle with limits (VHX and VHY) of a real Hall sensor comparator function including offset deviations. As long as the point of intersection 190 is situated within the defined Hall sensor amplitude circle 191, the decision about the correct half-plane can be made reliably.

Figure 10:
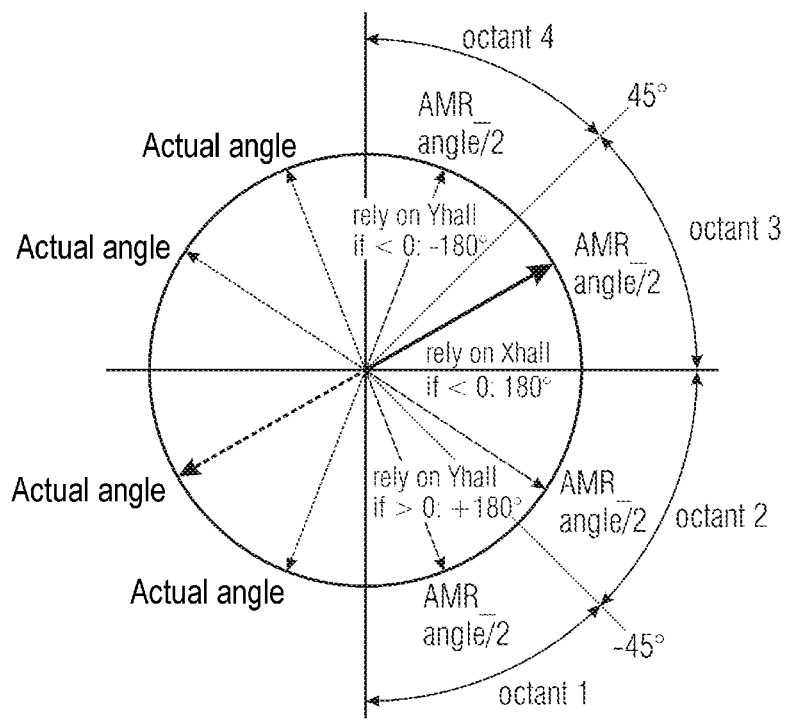
FIG. 10 shows a further amplitude circle for elucidating the correction of the half-plane in AMR-based sensors in accordance with a further exemplary embodiment.

FIG. 10 shows an alternative exemplary embodiment for determining the correct half-plane. Here the full mechanical 360° rotation of the rotor component 102 is divided into a total of eight octants. Here, too, the 180° angle correction is carried out by means of the Hall effect sensor signals (Xhall, Yhall), which can likewise be generated by means of a comparator function (only the coordinate system is different in comparison with FIG. 9).

FIG. 10 shows the fundamental four octants of the half unit circle for which AMR-based sensor signals can be reconstructed without any problems. In this regard, the Hall effect sensor signal (Xhall) of the Hall effect sensor arranged in the X-direction can be considered for example within the 2nd octant (between 0° and −45°) and within the 3rd octant (between 0° and +45°). If said signal Xhall is less than 0, then 180° are added thereto. On the other hand, the Hall effect sensor signal (Yhall) of the Hall effect sensor arranged in the Y-direction can be considered for example within the 1st octant (between −45° and −90°) and within the 4th octant (between +45° and +90°). If said signal Yhall is less than 0, then 180° are added thereto. In order to reconstruct the full 360°, additional information can be used, for example from a minimal vertical Hall-effect-based angle sensor or magnetic switches.

An implementation of this corrected angle calculation in Python code is indicated below:

```
def cordic(vec_AMR, vec_VHall):
    """Reconstruct the magnetic angle from AMR and mini-
        mal vertical Hall sensor signals.
    inputs:
    vec_AMR . . . output from AMR-based angle sensor
``` vec_VHall . . . output from vertical Hall-based angle sensor (0=Xhall, 1=Yhall)
"""
    angle_AMR=np.rad2deg(np.arctan 2(vec_AMR[1], vec_AMR[0])) #[°]; from −180° to 180°
    octant1=(angle_AMR/2<−45)#rely on VHallY, add 180° if positive
    octant2=(−45<=angle_AMR/2) & (angle_AMR/2<0) #rely on VHallX, add 180° if negative
    octant3=(0<=angle_AMR/2) & (angle_AMR/2<45)#rely on VHallX, subtract 180° if negative
    octant4=(45<=angle_AMR/2)#rely on VHallY, subtract 180° if negative
    angle_out=angle_AMR/2
    angle_out[octant1 & (vec_VHall[1]>0)]+=180
    angle_out[octant2 & (vec_VHall[0]<0)]+=180
    angle_out[octant3 & (vec_VHall[0]<0)]−=180
    angle_out[octant4 & (vec_VHall[1]<0)]−=180
    return angle_out Provided that an initial rotation can be ensured, which for example is also used for a start-up calibration for amplitude and offset, the second channel (VHX) of the Hall effect sensor can be disregarded. The decision point for the half-plane is here if the AMR intersects its 180° angle point.

A corresponding numerical simulation was carried out for the verification of this method proposed herein, in order to prove the implementability of this concept. For this purpose, the sensor architecture proposed herein was simulated in Python.

Figure 11:
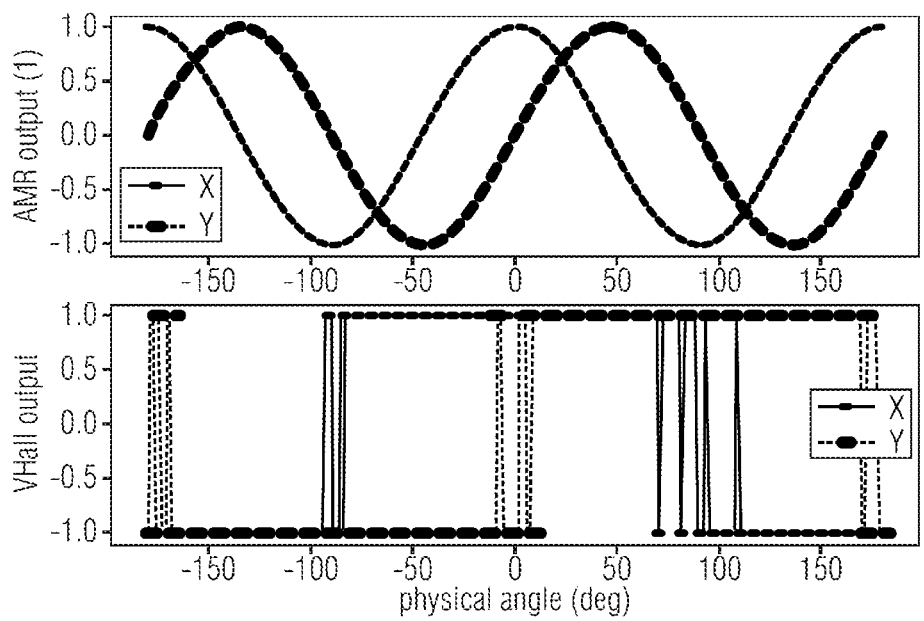
FIG. 11 shows simulation results with sensor output signals with a correction of the half-plane in AMR-based sensors in accordance with one exemplary embodiment.

Firstly, a rotating magnetic field with a typical amplitude was generated. This magnetic field was measured with two analytical sensor models (FIG. 11), a highly precise AMR-based angle sensor (0.05° angle noise and 180° periodicity of the output signals), and vertical Hall-effect-based switches (error corresponding to 10° angle noise, 360° periodicity of the output signals, 1-bit output for each of the two output channels). FIG. 11 (top) shows the output signals of the AMR-based angle sensor, and FIG. 11 (bottom) shows the output signals of the vertical Hall effect switches as a function of the true mechanical angle of a rotating magnetic field.

Figure 12:
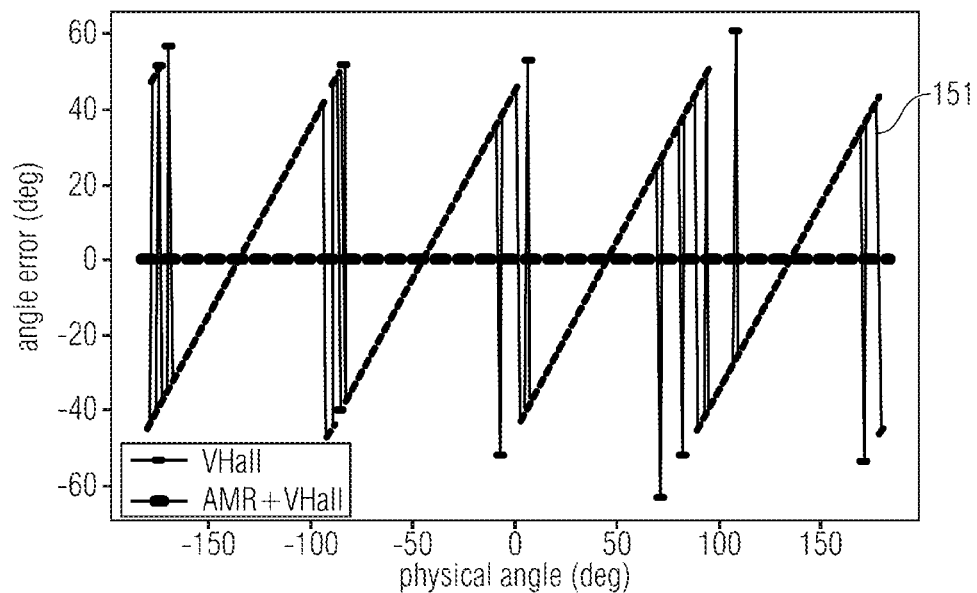
FIG. 12 shows simulation results of the residual angle error after correction of the half-plane in AMR-based sensors in accordance with one exemplary embodiment.

These output signals were processed with the generalized CORDIC function (vec_AMR, vec_VHall), see above. The reconstructed angles were plotted in FIG. 12. The angle error 151 of the angle reconstructed by means of the vertical Hall effect switch can be seen here, as can the angle error 152 of the combination of the AMR-based sensor and the vertical Hall effect switches. Despite the imperfect output signal of the vertical Hall effect switches, the reconstruction of the correct octant was correct for each sample point.

The concept described herein can be used for any system solutions which use discrete Hall effect sensors in combination with AMR-based sensors. In this case, it is advantageous if the Hall effect sensor chip is arranged as near as possible to the AMR sensor chip.

With this concept, therefore, the correct 180° half-plane of the angle output signal of an AMR-based angle sensor can be determined unambiguously, specifically using at least one, and preferably two vertical Hall effect sensors 120, 121 arranged orthogonally to one another in combination with an AMR-based sensor 110.

The exemplary embodiments described above merely represent an illustration of the principles of the concept described herein. It goes without saying that modifications and variations of the arrangements and details described herein will become apparent to others skilled in the art. Therefore, the intention is for the concept described herein to be restricted only by the scope of protection of the patent claims hereinafter, and not by the specific details that have been presented based on the description and the explanation of the exemplary embodiments herein.

Although some aspects have been described in association with a device, it goes without saying that these aspects also constitute a description of the corresponding method, such that a block or a component of a device should also be understood as a corresponding method step or as a feature of a method step. Analogously thereto, aspects that have been described in association with or as a method step also constitute a description of a corresponding block or detail or feature of a corresponding device.

Some or all of the method steps can be carried out by a hardware apparatus (or using a hardware apparatus), such as, for example, a microprocessor, a programmable computer or an electronic circuit. In some exemplary embodiments, some or a plurality of the most important method steps can be performed by such an apparatus.

Depending on specific implementation requirements, exemplary embodiments can be implemented in hardware or in software or at least partly in hardware or at least partly in software. The implementation can be effected using a digital storage medium, for example a floppy disk, a DVD, a Blu-ray disk, a CD, a ROM, a PROM, an EPROM, an EEPROM or a FLASH memory, a hard disk or some other magnetic or optical storage unit on which are stored electronically readable control signals which can interact or interact with a programmable computer system in such a way that the respective method is carried out. Therefore, the digital storage medium can be computer-readable.

Some exemplary embodiments thus comprise a data carrier having electronically readable control signals which are able to interact with a programmable computer system in such a way that one of the methods described herein is carried out.

Generally, exemplary embodiments can be implemented as a computer program product comprising a program code, wherein the program code is effective for carrying out one of the methods when the computer program product runs on a computer.

The program code can for example also be stored on a machine-readable carrier.

Other exemplary embodiments comprise the computer program for carrying out one of the methods described herein, wherein the computer program is stored on a machine-readable carrier. In other words, one exemplary embodiment of the method described herein is therefore a computer program having a program code for carrying out one of the methods described herein when the computer program runs on a computer.

A further exemplary embodiment of the method described herein is therefore a data carrier (or a digital storage medium or a computer-readable medium) on which is recorded the computer program for carrying out one of the methods described herein. The data carrier or the digital storage medium or the computer-readable medium is typically tangible and/or nonvolatile.

A further exemplary embodiment of the method described herein is therefore a data stream or a sequence of signals which constitutes the computer program for carrying out one of the methods described herein. The data stream or the sequence of signals can be configured for example to the effect of being transferred via a data communication connection, for example via the Internet.

A further exemplary embodiment comprises a processing device, for example a computer or a programmable logic component, which is configured or adapted to the effect of carrying out one of the methods described herein.

A further exemplary embodiment comprises a computer on which the computer program for carrying out one of the methods described herein is installed.

A further exemplary embodiment comprises a device or a system designed to transmit a computer program for carrying out at least one of the methods described herein to a receiver. The transmission can be effected electronically or optically, for example. The receiver can be, for example, a computer, a mobile device, a memory device or a similar device. The device or the system can comprise for example a file server for transmitting the computer program to the receiver.

In some exemplary embodiments, a programmable logic component (for example a field programmable gate array, an FPGA) can be used to carry out some or all functionalities of the methods described herein. In some exemplary embodiments, a field programmable gate array can interact with a microprocessor in order to carry out one of the methods described herein. Generally, in some exemplary embodiments, the methods are carried out on the part of an arbitrary hardware device. The latter can be universally usable hardware such as a computer processor (CPU) or hardware specific to the method, such as an ASIC, for example.

The exemplary embodiments described above merely represent an illustration of the principles of the concept described herein. It goes without saying that modifications and variations of the arrangements and details described herein will become apparent to others skilled in the art. Therefore, the intention is for the concept described herein to be restricted only by the scope of protection of the patent claims hereinafter, and not by the specific details that have been presented on the basis of the description and the explanation of the exemplary embodiments herein.

What is claimed is:

1. A magnetic-field-based angle sensor system, comprising:
   a stator component;
   a rotor component configured to rotate relative to the stator component,
   wherein the rotor component comprises a multipole magnet;
   a first magnetic field sensor configured to:
      operate in a saturation operation, and
      determine a rotation angle of the rotor component around an axis perpendicular to a surface of the stator component based on a magnetic field of the multipole magnet;
   a second magnetic field sensor configured to:
      operate in a linear operation, and
      ascertain an external magnetic stray field acting on the magnetic-field-based angle sensor system; and
   a controller configured to;
      perform an autocalibration on output signals of the second magnetic field sensor to ascertain stray-field-dependent compensation parameters corresponding to the external magnetic stray field, and
      compensate for a stray-field-dependent measurement deviation in the determination of the rotation angle based on the stray-field-dependent compensation parameters.

2. The magnetic-field-based angle sensor system of claim 1, wherein the first magnetic field sensor is a magnetoresistive sensor which utilizes an anisotropic magneto-resistive effect (AMR), a giant magnetoresistance effect (GMR), a colossal magnetoresistive effect (CMR), or a tunneling magnetoresistance effect (TMR).

3. The magnetic-field-based angle sensor system of claim 1, wherein the second magnetic field sensor is a Hall effect sensor.

4. The magnetic-field-based angle sensor system of claim 3, wherein the Hall effect sensor is configured as a vertical Hall effect plate arranged vertically with respect to the first magnetic field sensor.

5. The magnetic-field-based angle sensor system of claim 1,
   wherein the stray-field-dependent compensation parameters include at least one of offset information or amplitude information of the output signals.

6. The magnetic-field-based angle sensor system of claim 5, wherein the stray-field-dependent compensation parameters include a ratio between the offset information and the amplitude information, in accordance with:
   the offset information/the amplitude information.

7. The magnetic-field-based angle sensor system of claim 5, wherein the controller is further configured to:
   apply the stray-field-dependent compensation parameters to output signals of the first magnetic field sensor to compensate for the stray-field-dependent measurement deviation in the determination of the rotation angle; and
   carry out an angle calculation indicating the rotation angle based on the output signals of the first magnetic field sensor.

8. The magnetic-field-based angle sensor system of claim 7, wherein the controller is configured to:
   carry out an amplitude-phase-offset correction of the output signals of the first magnetic field sensor before the stray-field-dependent compensation parameters are applied to the output signals of the first magnetic field sensor,
      wherein at least one of an amplitude offset compensation or a phase offset compensation is applied to the output signals of the first magnetic field sensor to carry out the amplitude-phase-offset correction.

9. The magnetic-field-based angle sensor system of claim 5, wherein the controller is configured to:
   carry out an angle calculation indicating the rotation angle based on output signals of the first magnetic field sensor, and
   apply the stray-field-dependent compensation parameters to a result of the angle calculation to compensate for the stray-field-dependent measurement deviation in the determination of the rotation angle.

10. The magnetic-field-based angle sensor system of claim 9, wherein the controller is further configured to:
   carry out an amplitude-phase-offset correction of the output signals of the first magnetic field sensor before the stray-field-dependent compensation parameters is applied to the result of the angle calculation,
      wherein at least one of an amplitude offset compensation or a phase offset compensation is applied to the output signals of the first magnetic field sensor to carry out the amplitude-phase-offset correction.

11. A method, comprising:
   determining, by a magnetic-field-based angle sensor system using a first magnetic field sensor operating in a saturation operation, a rotation angle of a rotor component around an axis perpendicular to a surface of a stator component based on a magnetic field of a multipole magnet, wherein the rotor component is rotatable relative to the stator component and comprises the multipole magnet;

ascertaining, by the magnetic-field-based angle sensor system using a second magnetic field sensor operating in a linear operation, an external magnetic stray field acting on the magnetic-field-based angle sensor system;

performing, by the magnetic-field-based angle sensor system, an autocalibration of output signals of the second magnetic field sensor to ascertain stray-field-dependent compensation parameters corresponding to the external magnetic stray field; and compensating, by the magnetic-field-based angle sensor system, for a stray-field-dependent measurement deviation in the determination of the rotation angle based on the stray-field-dependent compensation parameters.

12. The method of claim 11,
wherein the stray-field-dependent compensation parameters contain at least one of offset information or amplitude information of the output signals of the second magnetic field sensor.

13. The method of claim 12, further comprising:
applying the stray-field-dependent compensation parameters to output signals of the first magnetic field sensor to compensate for the stray-field-dependent measurement deviation in the determination of the rotation angle; and performing, based on applying the stray-field-dependent compensation parameters, an angle calculation indicating the rotation angle based on the output signals of the first magnetic field sensor.

14. The method of claim 13, further comprising:
performing an autocalibration of the output signals of the first magnetic field sensor before applying the stray-field-dependent compensation parameters to the output signals of the first magnetic field sensor,
wherein at least one of an amplitude offset compensation or a phase offset compensation is applied to the output signals of the first magnetic field sensor when performing the autocalibration.

15. The method of claim 13, further comprising:
performing an autocalibration of the output signals of the first magnetic field sensor before applying the stray-field-dependent compensation parameters to a result of the angle calculation,
wherein at least one of an amplitude offset compensation or a phase offset compensation is applied to the output signals of the first magnetic field sensor when performing the autocalibration.

16. The method of claim 12, further comprising:
performing an angle calculation indicating the rotation angle based on output signals of the first magnetic field sensor, and applying the stray-field-dependent compensation parameters to a result of the angle calculation to compensate for the stray-field-dependent measurement deviation in the determination of the rotation angle.

17. A non-transitory computer-readable medium comprising a computer program having a program code for causing a programmable hardware device to:
determine, using a first magnetic field sensor operating in a saturation operation, a rotation angle of a rotor component around an axis perpendicular to a surface of a stator component based on a magnetic field of a multipole magnet, wherein the rotor component is rotatable relative to the stator component and comprises the multipole magnet;
ascertain, using a second magnetic field sensor operating in a linear operation, an external magnetic stray field acting on the programmable hardware device;
perform an autocalibration of output signals of the second magnetic field sensor to ascertain stray-field-dependent compensation parameters corresponding to the external magnetic stray field; and
compensate for a stray-field-dependent measurement deviation in the determination of the rotation angle based on the stray-field-dependent compensation parameters.

18. The non-transitory computer-readable medium of claim 17,
wherein the stray-field-dependent compensation parameters contain at least one of offset information or amplitude information of the output signals of the second magnetic field sensor.

19. The non-transitory computer-readable medium of claim 18, wherein the program code further causes the programmable hardware device to:
apply the stray-field-dependent compensation parameters to output signals of the first magnetic field sensor to compensate for the stray-field-dependent measurement deviation in the determination of the rotation angle; and
perform, based on applying the stray-field-dependent compensation parameters, an angle calculation indicating the rotation angle based on the output signals of the first magnetic field sensor.

20. The non-transitory computer-readable medium of claim 18, wherein the program code further causes the programmable hardware device to:
perform an angle calculation indicating the rotation angle based on output signals of the first magnetic field sensor, and
apply the stray-field-dependent compensation parameters to a result of the angle calculation to compensate for the stray-field-dependent measurement deviation in the determination of the rotation angle.

* * * * *